(12) United States Patent
Lin

(10) Patent No.: US 9,703,322 B2
(45) Date of Patent: Jul. 11, 2017

(54) WEARABLE DEVICE

(71) Applicant: HTC Corporation, Taoyuan County (TW)

(72) Inventor: Yi-Pang Lin, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 18 days.

(21) Appl. No.: 14/467,065

(22) Filed: Aug. 25, 2014

(65) Prior Publication Data

US 2015/0277489 A1   Oct. 1, 2015

Related U.S. Application Data

(60) Provisional application No. 61/973,274, filed on Apr. 1, 2014.

(51) Int. Cl.
| | |
|---|---|
| *G06F 1/16* | (2006.01) |
| *A44C 5/00* | (2006.01) |
| *A44C 5/12* | (2006.01) |
| *H05K 1/18* | (2006.01) |

(52) U.S. Cl.
CPC ............ *G06F 1/163* (2013.01); *A44C 5/0053* (2013.01); *A44C 5/12* (2013.01); *H05K 1/189* (2013.01); *H05K 2201/10128* (2013.01)

(58) Field of Classification Search
CPC ...... G06F 1/163; G06F 1/1652; G06F 3/0202; H05K 1/028; H05K 2201/10128; H05K 1/189; A44C 5/0007; A44C 5/0053; A44C 5/12
USPC .......................... 361/679.03, 679.34, 679.19
See application file for complete search history.

(56) References Cited

U.S. PATENT DOCUMENTS

| | | | |
|---|---|---|---|
| 2,707,800 A | 5/1955 | Popper | |
| 4,087,989 A * | 5/1978 | Taran | A44C 5/0084 63/11 |
| 4,412,751 A | 11/1983 | Jeannet et al. | |
| 4,624,581 A | 11/1986 | Mock et al. | |
| 4,674,299 A | 6/1987 | Azar | |

(Continued)

FOREIGN PATENT DOCUMENTS

| | | |
|---|---|---|
| CN | 1327779 | 12/2001 |
| GB | 2505981 | 3/2014 |

(Continued)

OTHER PUBLICATIONS

"Office Action of German Counterpart Application," issued on Jan. 23, 2015, p. 1-p. 10.

(Continued)

*Primary Examiner* — Anthony Haughton
*Assistant Examiner* — Ingrid Wright
(74) *Attorney, Agent, or Firm* — Jianq Chyun IP Office

(57) ABSTRACT

A wearable device adapted to be worn on a user's wrist is provided. The wearable device includes a first bracket, a second bracket, a shaft structure, and a soft covering material. The shaft structure is connected to the one side of the first bracket, also to the one side of the second bracket for forming a wristband. The other side of the first bracket and the other side of the second bracket are configured to be departed from each other, and the first bracket and the second bracket are pivoted with each other through the shaft structure. Furthermore, the first bracket, the second bracket, and the shaft structure are covered by the soft covering material.

10 Claims, 9 Drawing Sheets

(56) References Cited

U.S. PATENT DOCUMENTS

| | | |
|---|---|---|
| 5,872,744 A | 2/1999 | Taylor |
| 5,944,661 A | 8/1999 | Swette et al. |
| 6,457,215 B1 | 10/2002 | Martin |
| 6,549,791 B1 | 4/2003 | Jeon et al. |
| 6,550,930 B1 | 4/2003 | Portouche |
| 6,619,836 B1 | 9/2003 | Silvant et al. |
| 6,681,014 B1 | 1/2004 | Ghassabian |
| 6,748,631 B2 | 6/2004 | Iguchi et al. |
| 6,754,069 B2 | 6/2004 | Harada |
| 6,829,809 B2 * | 12/2004 | Labrousse ............... B60R 11/02 16/438 |
| 7,023,426 B1 | 4/2006 | Robinson |
| 7,353,048 B2 | 4/2008 | Pontoppidan et al. |
| 7,460,085 B2 * | 12/2008 | Ishii ..................... G06F 3/1423 345/1.1 |
| 7,568,263 B2 | 8/2009 | Kim et al. |
| 2003/0006572 A1 * | 1/2003 | Huang .................... A45C 5/14 280/79.11 |
| 2004/0209657 A1 | 10/2004 | Ghassabian |
| 2005/0174302 A1 * | 8/2005 | Ishii ..................... G06F 3/1423 345/30 |
| 2006/0203621 A1 | 9/2006 | Brodmann |
| 2010/0000257 A1 | 1/2010 | Sweeney |
| 2010/0071413 A1 | 3/2010 | Shamlian |
| 2012/0182677 A1 * | 7/2012 | Seo ........................ H04B 1/385 361/679.01 |
| 2012/0274508 A1 | 11/2012 | Brown et al. |
| 2012/0297592 A1 | 11/2012 | Schenk |
| 2013/0154826 A1 * | 6/2013 | Ratajczyk ............... G08B 7/06 340/539.11 |

FOREIGN PATENT DOCUMENTS

| | | | |
|---|---|---|---|
| JP | 2000209319 | | 7/2000 |
| JP | 2003070530 A | * | 3/2003 |
| TW | M411141 | | 9/2011 |
| WO | 2014031944 | | 2/2014 |

OTHER PUBLICATIONS

"Office Action of Taiwan Counterpart Application", issued on Oct. 13, 2015, p. 1-p. 5.

* cited by examiner

WEARABLE DEVICE

CROSS-REFERENCE TO RELATED APPLICATION

This application claims the priority benefits of U.S. provisional application Ser. No. 61/973,274, filed on Apr. 1, 2014. The entirety of the above-mentioned patent application is hereby incorporated by reference herein and made a part of this specification.

BACKGROUND OF THE DISCLOSURE

Field of the Disclosure

The invention relates to a wearable device, and more particularly, to a wearable device having a shaft structure.

Description of Related Art

With the rapid development of mobile communication technology, mobile electronic devices are generally required to have quality such as light, thin, compact and readily portable, so as to comply with the consumers' demands and market development trends. Recently, mobile communication functions are further integrated into wearable devices, such that the mobile communication devices may be wearable for a user and also serve as wearable devices such as intelligent wristbands, intelligent watches, and the like.

In the case of the recent wearable devices like intelligent wristbands, the dimension thereof is mostly fixed, thus unable to be put on positions like human wrists suitably. In addition, the opening portions for wearing of many of the wearable devices for wrists are unable to elastically expand and contract, or cannot be adjustable according to the size of a user's wrist. Therefore, they likely cannot fit the user's wrist and are difficult to wear. Furthermore, manufacturing method of many of the wearable devices is integrally manufacturing method, and the devices do not have any size adjustable mechanism, and have to be produced with different sizes so as to meet the requirement for fitting different users.

SUMMARY OF THE INVENTION

The invention provides a wearable device having a shaft structure and adapted for suitably adjust the wearable device so as to be wearable for different users.

The invention provides a wristband assembly having a shaft structure and adapted for suitably adjust the wearable device so as to be wearable for different users.

In an exemplary embodiment of the invention, a wearable device including a first bracket, a second bracket, a shaft structure, and a soft covering material is provided. The shaft structure connects one side of the first bracket and one side of the second bracket, so as to form a wristband. The other side of the first bracket and the other side of the second bracket are separated from each other, and the first bracket and the second bracket are adapted to relatively pivot through the shaft structure. The soft covering material covers the first bracket, the second bracket and the shaft structure.

In light of the above, the wearable device of the invention has a shaft structure, and the first bracket and the second bracket of the wearable device may be pivoted to each other through the shaft structure so as to form a wristband. The wearable device adjusts the size of the wristband through the shaft structure, so as to fit various sizes of different users' wrists, and the user may conveniently put on and take off the wearable device. In addition, the wearable device may be covered by the soft covering material, so as to increase the feel of comfort during wearing, and also provides protection and color variety to the device outer appearance.

To make the above features and advantages of the invention more comprehensible, several embodiments accompanied with drawings are described in detail as follows.

DESCRIPTION OF THE EMBODIMENTS

Figure 1:
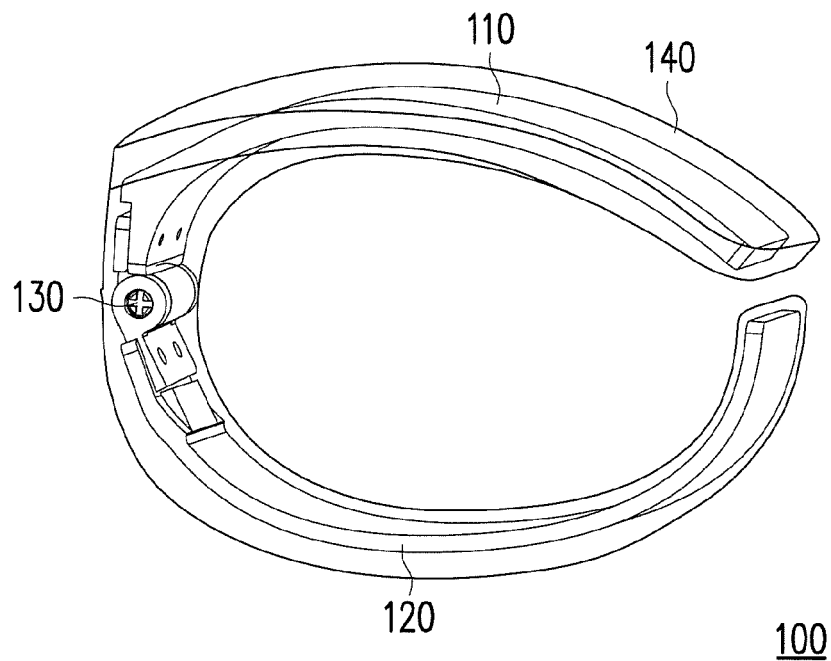
FIG. 1 is a schematic perspective view illustrating a wearable device according to an exemplary embodiment of the invention.
Figure 2:
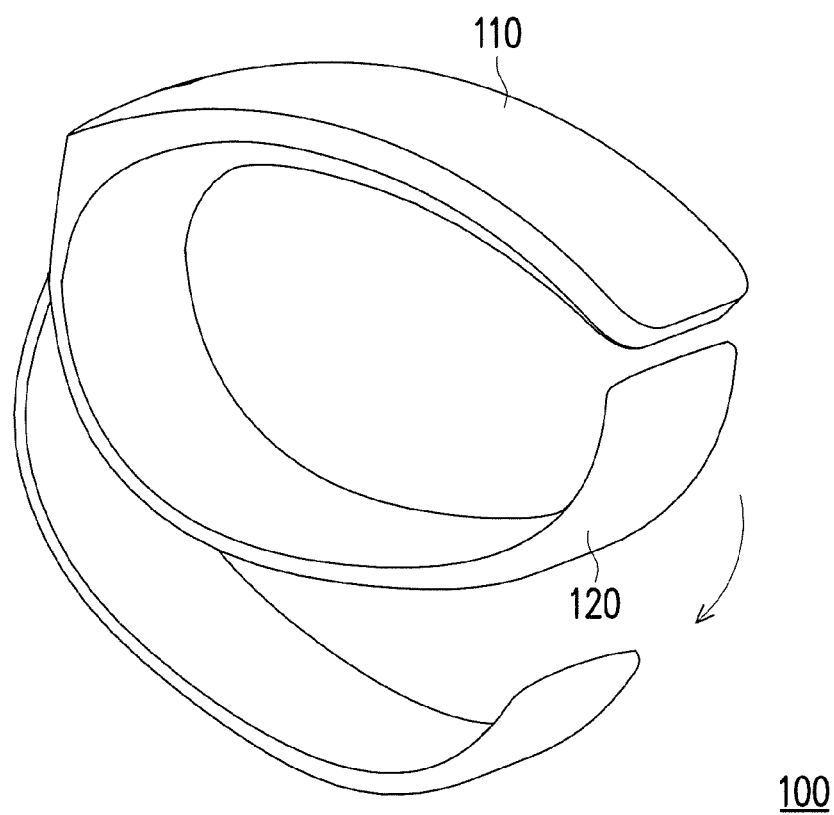
FIG. 2 is a schematic view illustrating the rotating motion of the wearable device depicted in FIG. 1.

FIG. 1 is a schematic perspective view illustrating a wearable device according to an exemplary embodiment of the invention. FIG. 2 is a schematic view illustrating the rotating motion of the wearable device depicted in FIG. 1. Referring to FIG. 1, the wearable device 100 includes a first bracket 110, a second bracket 120, a shaft structure 130, and a soft covering material 140. The shaft structure 130 connects one side of the first bracket 110 and one side of the second bracket 120, so as to form a wristband. The other side of the first bracket 110 and the other side of the second bracket 120 are separated from each other, and the first bracket 110 and the second bracket 120 are adapted to relatively pivot through the shaft structure 130. In addition, the surfaces of the first bracket 110, the second bracket 120 and the shaft structure 130 may be covered by the soft covering material 140. In addition, referring to FIG. 2, in the embodiment, the second bracket 120 of the wearable device 100 may rotate relative to the first bracket 110 along the arrow direction shown in FIG. 2, or may return to the initial relative position of the first bracket 110 and the second bracket 120 along the direction reversed to the arrow direction.

In the embodiment, the soft covering material 140 which covers the wearable device 100 may include a soft material having elasticity and stretchability such as silicon, rubber, and the like. The wearable device 100 may be suitably wearable for a user's wrist through the disposing of the soft covering material 140, and during wearing process it may fit the shape of the user's wrist so as to increase the feel of comfort. In addition, in the embodiment, the material of the soft covering material 140 may be provided with at least two colors, thus in the case of the exterior design, compared to the device provided with a single color, different components, e.g., the first bracket 110 and the second bracket 120, of the wearable device 100 may be distinguished by the material with different colors. Especially, in the case that the wearable device 100 has buttons corresponding to different functions, material with different colors may be provided for enhancing identifying effect and convenience of use. Moreover, the soft covering material 140 has elasticity or stretchability, thus when the wearable device 100 is subjected to an impact, for example falling onto the ground, the soft covering material 140 may provide buffering effect and protects the wearable device 100.

In addition, in the embodiment, the shaft structure 130 may include a multi-section hinge mechanism 132. The first bracket 110 may pivot relative to the second bracket 120 in a larger angle through the multi-section hinge mechanism 132, and stops at a position in accordance with the angle, at the same time, the other sides of the first bracket 110 and the second bracket 120 which are separated from each other may also have a larger separated distance due to the pivoting of the first bracket 110 and the second bracket 120. The larger separated distance between the first bracket 110 and the second bracket 120 may let the user's wrist conveniently enter or leave the wearable space formed by the encircling of the first bracket 110 and the second bracket 120, during the process of the user putting on or taking off the wearable device 100. On the other hand, the first bracket 110 may pivot relative to the second bracket 120 in a smaller angle through the shaft structure 130, and stops at a position in accordance with the angle, at the same time, the other sides of the first bracket 110 and the second bracket 120 which are separated from each other may also have a smaller separated distance due to the pivoting of the first bracket 110 and the second bracket 120. The abovementioned size of the separated distance may be smaller than the size of the user's wrist, such that the separated distance between the first bracket 110 and the second bracket 120 may not be too large during the user wearing and the wearable device 100 may not loose from the user's wrist.

Figure 3A:
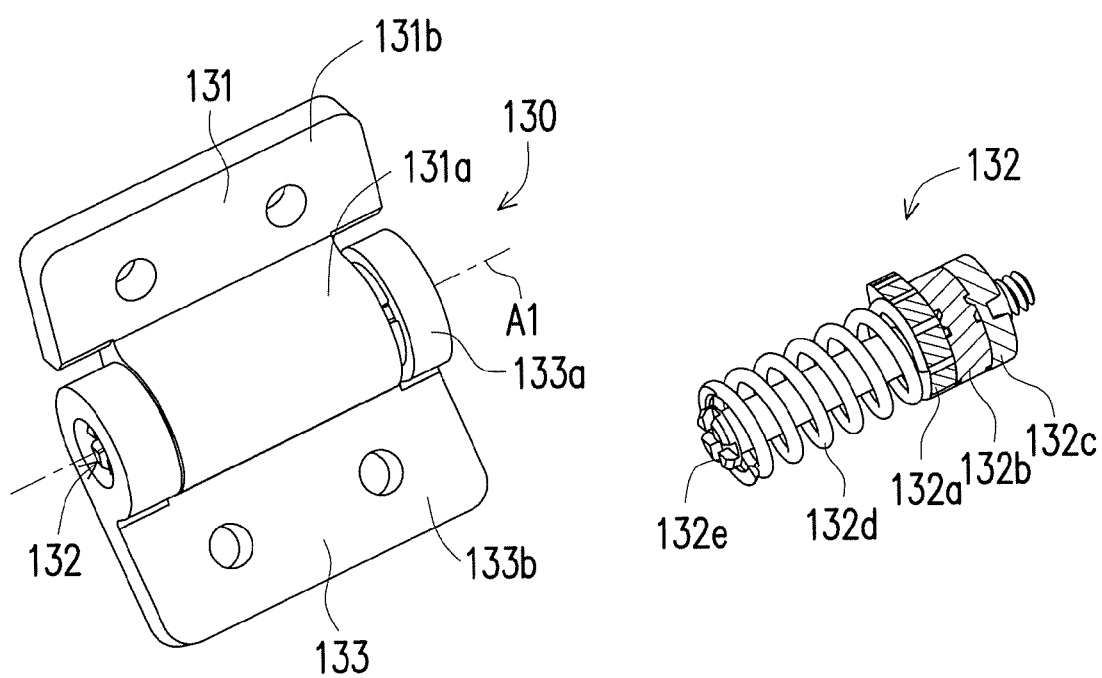
FIG. 3A through FIG. 3C are schematic views illustrating the part of components of the shaft structure of the wearable device depicted in FIG. 1.
Figure 3B:
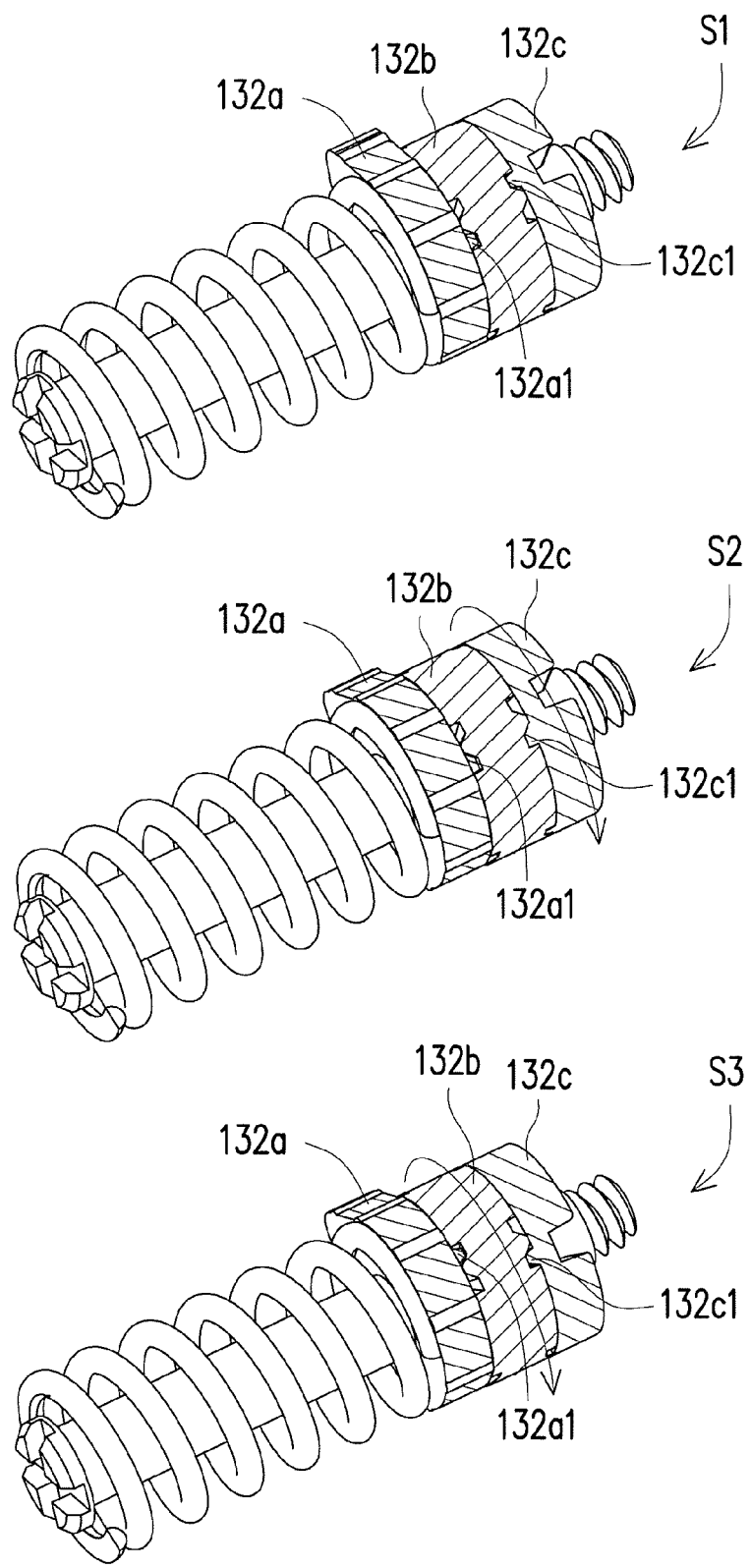
Figure 3C:
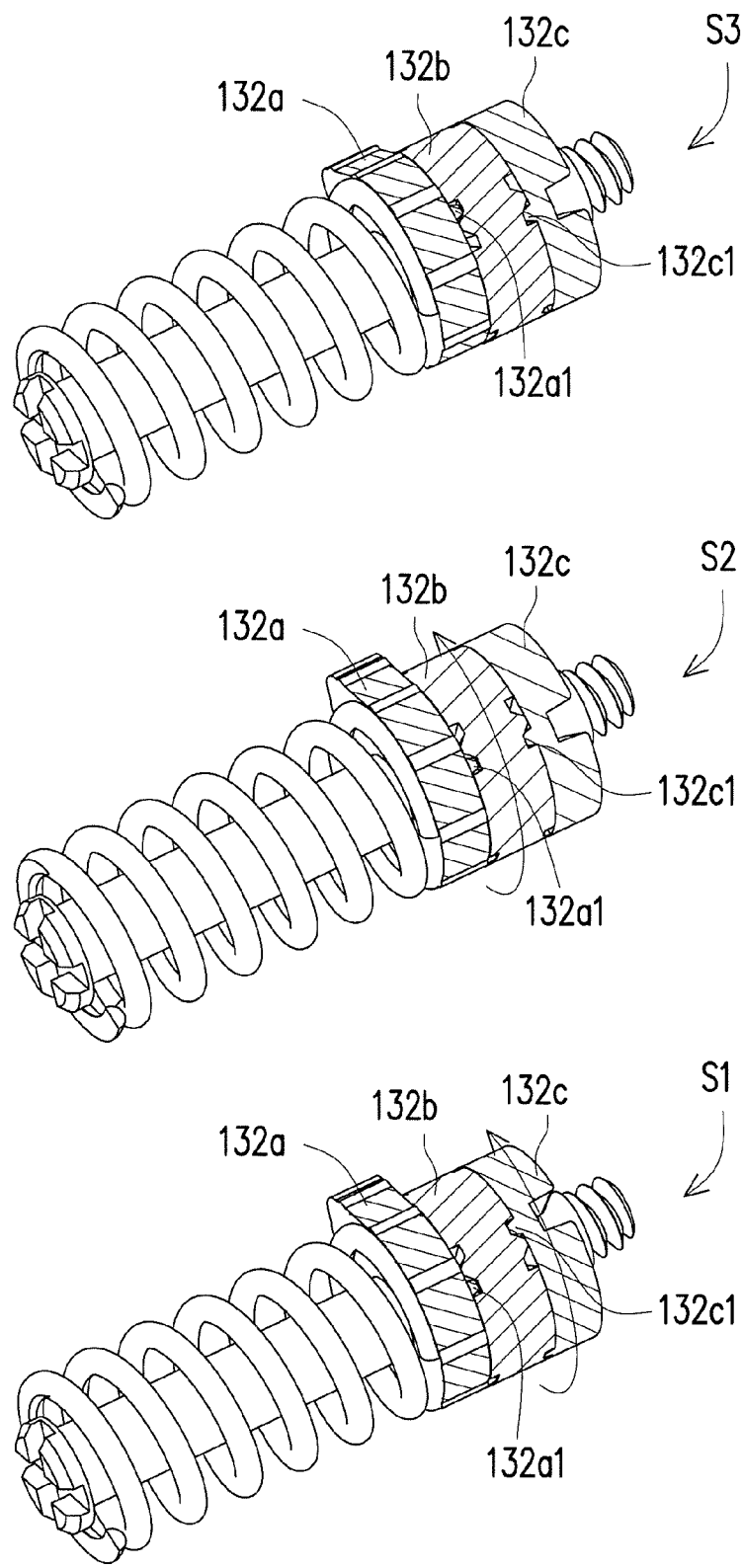

FIG. 3A through FIG. 3C are schematic views illustrating the part of components of the shaft structure of the wearable device depicted in FIG. 1. Referring to FIG. 3B, in the embodiment, the multi-section hinge mechanism 132 may include a rotation angle positioning portion 132a, a first rotating portion 132b and a second rotating portion 132c. The rotation angle positioning portion 132a and the second rotating portion 132c respectively has hooks 132a1, 132c1 adapted to be latched with a plurality of recesses of the first rotating portion 132b and positioned. The first rotating portion 132b and the second rotating portion 132c may rotate with respect to the rotation angle positioning portion 132a, and may be positioned on the relative positions of the corresponding rotation angle. In addition, the second rotating portion 132c may have a rotating stroke relative to the first rotating portion 132b and the rotation angle positioning portion 132a, namely via the rotation of the second rotating portion 132c, between the hook 132c1 of the second rotating portion 132c and the recess of the first rotating portion 132b, the initial relative latching position shown in the step S1 of FIG. 3B is changed to the relative latching position shown in the step S2, then the second rotating portion 132c and the first rotating portion 132b are latched and fixed to each other. Then, the first rotating portion 132b may have another rotating stroke with respect to the rotation angle positioning portion 132a in the same rotating direction, and at the same time may drive the second rotating portion 132c which is latched and fixed with the first rotating portion 132b to each other to rotate together relative to the rotation angle positioning portion 132a. In other words, via the rotation of the first rotating portion 132b, the relative position shown in the step S2 of the recess of the first rotating portion 132b and the hook 132a1 of the rotation angle positioning portion 132a is changed to the relative position shown in the step S3, such that the first rotating portion 132b and the second rotating portion 132c may simultaneously have another rotating stroke relative to the rotation angle positioning portion 132a. Therefore, in the wearable device 100 of the embodiment, the second bracket 120 relative to the first bracket 110 in the same rotating direction may have rotating stroke with at least two sections.

On the other hand, referring to FIG. 3C, when the rotating stroke mentioned above is finished, and when it is about to return to the relative initial position of the rotation angle positioning portion 132a and the first and second rotating portions 132b, 132c, first the first rotating portion 132b may drive the second rotating portion 132c to return to the relative position shown in the step S2 from the relative position shown in the step S3 with respect to the rotation angle positioning portion 132a. Then, the second rotating portion 132c may again return to the original initial position shown in the step S1 with respect to the rotation of the first rotating portion 132b, such that the second bracket 120 of the wearable device 100 may rotate multi-sectionally with respect to the first bracket 110 and return to the original initial position. In addition, in another embodiment of the invention, the order of the rotating strokes of the abovementioned steps S2 and S3 may be alternately replaced, and the same rotating movement effect may also be achieved. Additionally, the multi-section hinge mechanism 132 may have a spring 132d and a pivoting shaft 132e, wherein the spring 132d props against the rotation angle positioning portion 132a, used for providing an appropriate torque when the first rotating portion 132b and the second rotating portion 132c rotate with respect to the rotation angle positioning portion 132a. The pivoting shaft 132e passes through the rotation angle positioning portion 132a, the first rotating portion 132b, the second rotating portion 132c and the spring 132d.

Referring to FIG. 3A, in the embodiment, the shaft structure 130 may further include a first protective member 131 and a second protective member 133 which are pivoted to the multi-section hinge mechanism 132. The first protective member 131 and the second protective member 133 may respectively cover a portion of the multi-section hinge mechanism 132, so as to appropriately provide protection to the multi-section hinge mechanism 132. The first protective member 131 and the second protective member 133 may respectively have a fixing portion 131b and a fixing portion 133b, and fixed to the first bracket 110 and the second bracket 120 respectively by screwing or latching method. In detailed, the first protective member 131 may have a shaft sleeve 131a which is fixed and pivoted to the rotation angle positioning portion 132a along the shaft axis A1, so that the rotation angle positioning portion 132a is fixed on the first bracket 110 through the fixing portion 131b of the first protective member 131. On the other hand, the second protective member 133 may have a shaft sleeve 133a which is fixed and pivoted to the second rotating portion 132c along the shaft axis A1, so that the second rotating portion 132c is fixed on the second bracket 120 through the fixing portion 133b of the second protective member 133. As mentioned above, since the second rotating portion 132c may have multi-section rotation stroke with respect to the rotation angle positioning portion 132a, the second rotating portion 132c fixed on the second bracket 120 may drive the second bracket 120 to perform multi-section rotation with respect to the first bracket 110, such that the opening size between the first bracket 110 and the second bracket 120 may be multi-sectionally adjusted according to the user's requirement.

Figure 4A:
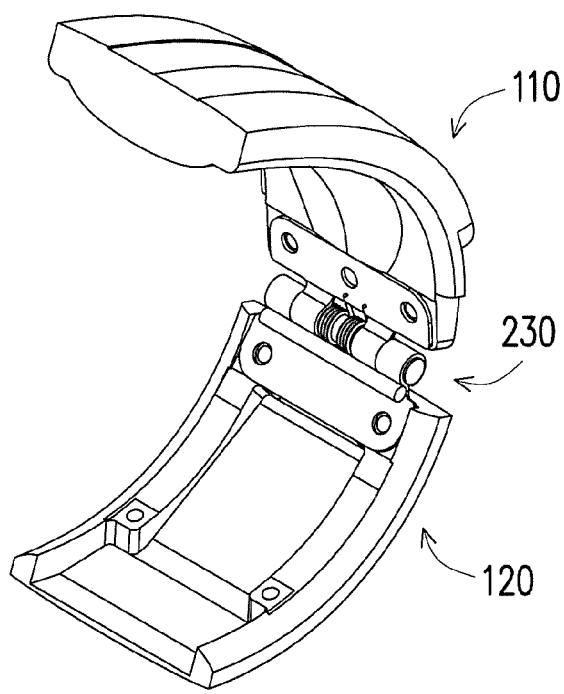
FIG. 4A and FIG. 4B are schematic views illustrating a part of components of a wearable device according to another exemplary embodiment of the invention.
Figure 4B:
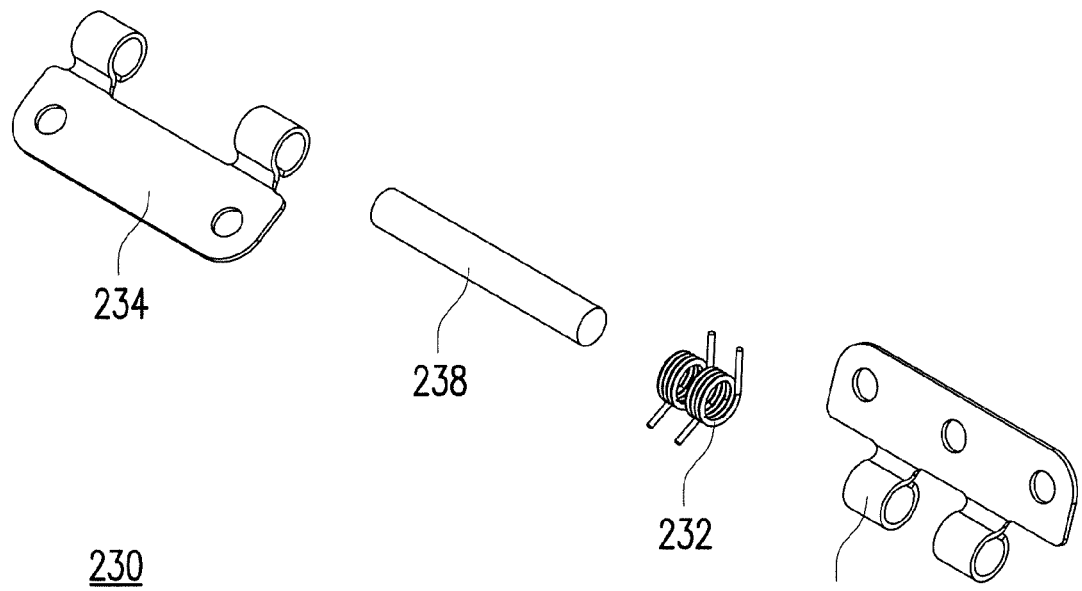

FIG. 4A and FIG. 4B are schematic views illustrating a part of components of a wearable device according to another exemplary embodiment of the invention. In the embodiment, the shaft structure 230 may include a torsion spring 232, a first fixing portion 234, a second fixing portion 236 and a pivoting shaft 238 passing through the aforementioned components. The first fixing portion 234 and the second fixing portion 236 may be fixed to the first bracket 110 and the second bracket 120 respectively by screwing or latching method. When the first bracket 110 rotates along the pivoting shaft 238 with respect to the second bracket 120, the wrist may suitably enter or leave the wearable space formed by the encircling of the first bracket 110 and the second bracket 120. When the user wears the wearable device 100 on the wrist, the torsion spring 232 may provide an appropriate elastic restoring force, so that the first bracket 110 and the second bracket 120 may elastically restrict or latch the wrist within the wearable space formed by the encircling thereof. Alternatively, when the user does not wear the wearable device 100, the first bracket 110 and the second bracket 120 may return to the relative initial position via the elastic restoring force provided by the torsion spring 232. In the embodiment, the shaft structure may be an annular spring structure via the torsion spring 232 and provides a pivoting method with a simpler structure. In addition, via the elastic restoring force provided by the torsion spring 232, the first bracket 110 and the second bracket 120 may relatively rotate, so as to comply with various sizes of wrists, and the structural complexity and the manufacturing cost of the wearable device 100 may be further reduced. In detailed, since the shaft structure 230 of the embodiment may tightly be covered within the soft covering material 140, the simpler structure configuration may reduce the obstruction by the soft covering material 140 when the torsion spring 232 acts, and the shaft structure 230 may smoothly rotate.

Figure 5:
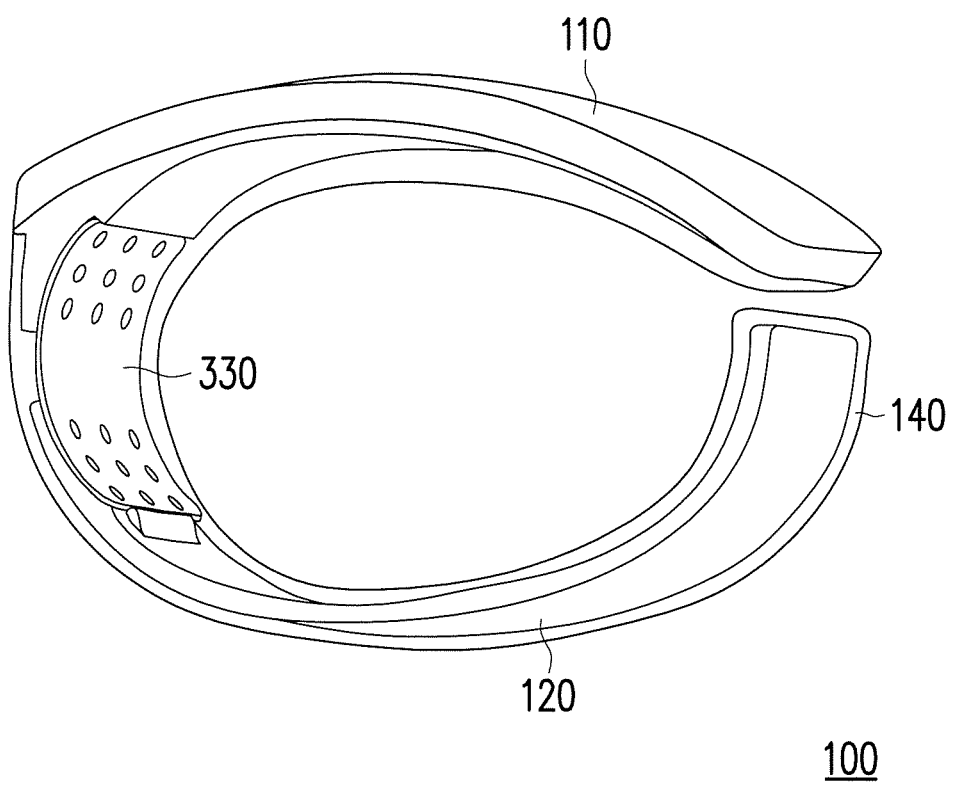
FIG. 5 is a schematic perspective view illustrating a wearable device according to another exemplary embodiment of the invention.

FIG. 5 is a schematic perspective view illustrating a wearable device according to another exemplary embodiment of the invention. In the embodiment, the shaft structure 130 is an elastic pad 330 which is expandable and recoverable, and the two ends of the elastic pad 330 are fixed on the first bracket 110 and the second bracket 120 respectively by latching or screwing method. The first bracket 110 and the second bracket 120 may be expanded or recovered to the initial relative positions via the flexible elastic characteristic of the elastic pad 330. In addition, through the expanding or recovering process of the first bracket 110 and the second bracket 120, the user may open and close the first bracket 110 and the second bracket 120, wear the wearable device 100 on the wrist, or take off the wearable device 100 from the wrist. Specifically, the elastic pad 330 may provide a wearable device with a simple structure which may be appropriately worn on the user's wrist, and adjusted according to the size of the user's wrist. In addition, the elastic pad 330 may be disposed on the wearable device 100 by a simple manufacturing process, the complexity and cost of the manufacturing process of the wearable device 100 may be reduced, advantaging replacing and maintaining parts of the wearable device 100.

Figure 6A:
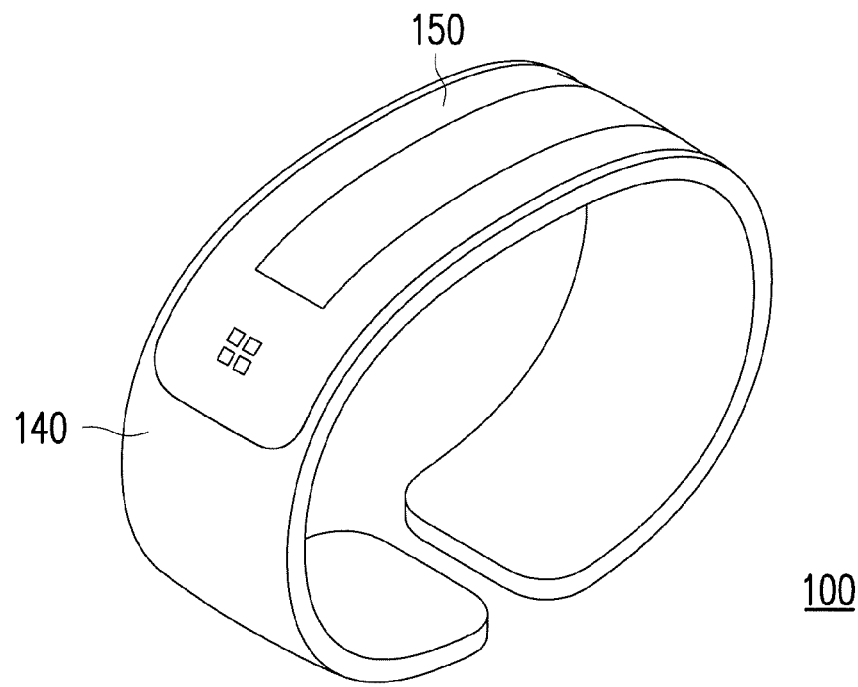
FIG. 6A through FIG. 6C are schematic perspective views illustrating a part of components of a wearable device according to another exemplary embodiment of the invention.
Figure 6B:
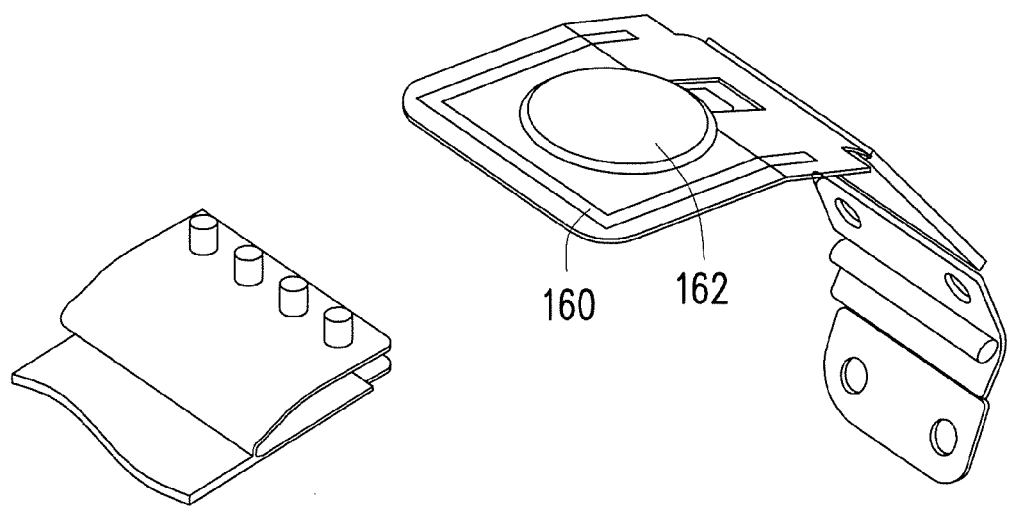
Figure 6C:
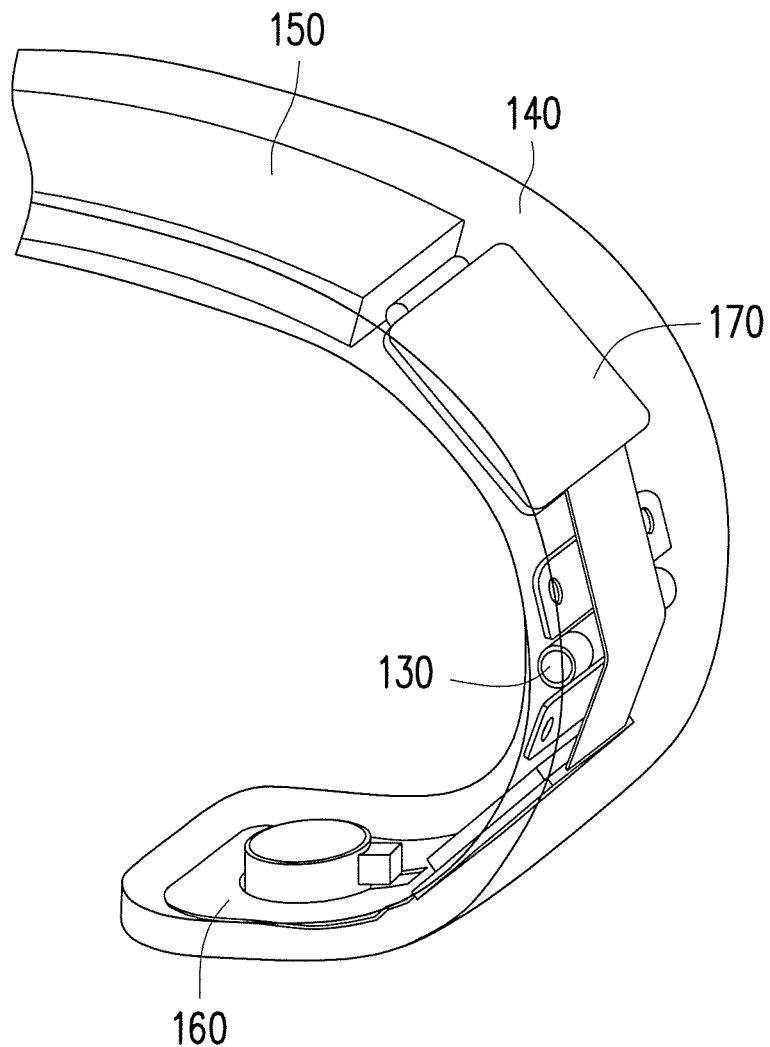

FIG. 6A through FIG. 6C are schematic perspective views illustrating a part of components of a wearable device according to another exemplary embodiment of the invention. Referring to FIG. 6A through FIG. 6C, in the embodiment, the first bracket 110 or the second bracket 120 of the wearable device 100 may have a plurality of electronic devices, the electronic devices may include a display unit 150, wherein the soft covering material 140 exposes a portion of the display unit 150 to another side of the wearable device 100 with respect to the wrist, the display unit 150 may include a touch display unit for displaying various information, and signals may be input via touch input method. In addition, the first or second bracket of the wearable device 100 may further include a control unit 160, and the display unit 150 and the flexible circuit board 170 of the control unit 160 may be connected via the shaft structure 130, wherein the control unit 160 may communicate and couple with other electronic devices through wireless transmission method such as Blue Tooth communication, so as to transmit electrical signals. In addition, the wearable device 100 of the embodiment may also be collocated with a monitoring device 162 used for measuring various physiological signals such as blood pressure, breathing, heartbeat or the like, and disposed on the control unit 160, so as to instantaneously monitor various physiological signals of the user.

Figure 7:
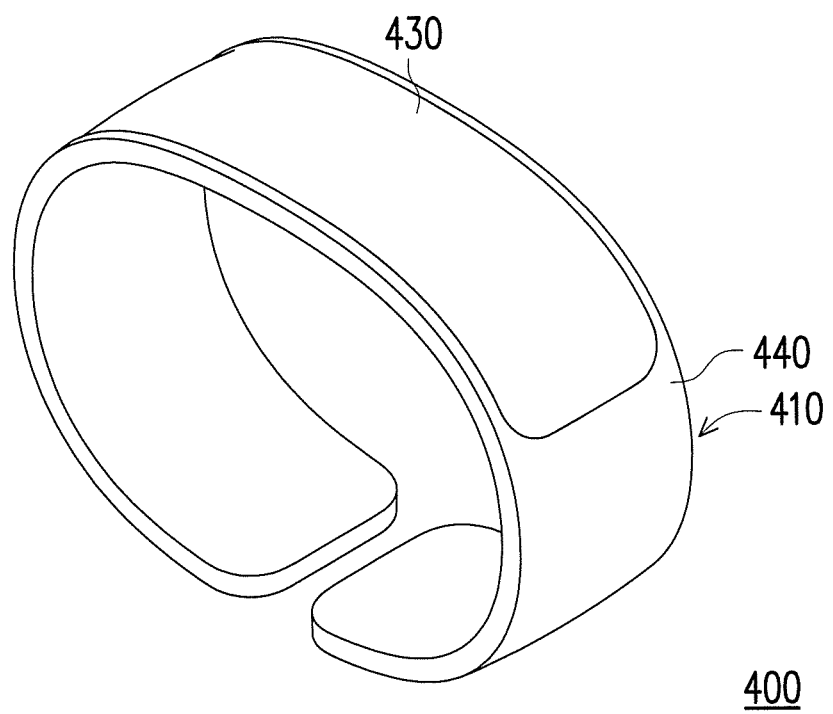
FIG. 7 is a schematic perspective view illustrating a wearable device according to another exemplary embodiment of the invention.

FIG. 7 is a schematic perspective view illustrating a wearable device according to another exemplary embodiment of the invention. Referring to FIG. 7, the first bracket 410 may be an arc-shaped bracket and may pivot the second bracket (not shown) within the arc-shaped bracket, and the included angle between the first bracket 410 and the second bracket may be used for adjusting the size of the wearable space of the wearable device 400. In the embodiment, the disposing manner of the first bracket 410 and the second bracket mentioned above may let the first bracket 110 to have a continuous arc curved surface with a larger area adapted to dispose a larger display unit 430. Touch display devices having touch control function and communication function may be disposed on the display unit 430 which has an organic light emitting diode (OLED) flexible display panel for example, so that the wearable device 400 may combine with the touch and communication function to become a wearable electronic device such as an intelligent wristband or an intelligent watch.

In light of the foregoing, the invention discloses a wearable device such as an intelligent wristband or an intelligent watch, for example. The wearable device has a first bracket and a second bracket which may relatively pivot and rotate by using the shaft structure, used for adjusting the wearable space of the wearable device to comply with various sizes of the users' wrists as required. Furthermore, the end of the wearable device that the first bracket and the second bracket are separated may be appropriately adjusted the distance therebetween during the process when the user wears or takes off the device, so that the user's wrist may conveniently enter or leave the wearable space formed by the encircling of the first bracket and the second bracket via the change of the distance between the first bracket and the second bracket. Therefore, the wearable device of the invention with a single or less device dimension may comply with the wearing requirement of most of the users, the manufacturing process and production cost of the wearable device may further be saved. On the other hand, through the soft covering material covering the main component of the wearable device, the outer surface of the device may be elastically covered, thus the wearable device may be more suitably put on the users' wrists, and the wearable device may provide buffering effect and protection when it is subjected to an impact. Moreover, the soft covering material with different colors may be applied to the wearable device so as to enhance the identifying effect and convenience of use.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A wearable device, comprising:
   a first bracket;
   a second bracket;
   a shaft structure, connecting one side of the first bracket and one side of the second bracket, the other side of the first bracket and the other side of the second bracket are separated from each other, and the first bracket and the second bracket are adapted to relatively pivot through the shaft structure; and
   a soft covering material, covering the first bracket, the second bracket and the shaft structure, wherein the shaft structure is located inside the soft covering material, and the soft covering material extends to a wearable space formed by the encircling of the first bracket and the second bracket.

2. The wearable device as claimed in claim 1, wherein the soft covering material comprises a rubber or a silicon.

3. The wearable device as claimed in claim 1, further comprising an electronic device disposed on the first bracket, wherein the soft covering material exposes at least a portion of the electronic device.

4. The wearable device as claimed in claim 3, wherein the electronic device comprises a display unit, and the soft covering material exposes a display surface of the display unit.

5. The wearable device as claimed in claim 4, further comprising a flexible printed circuit board and a control unit, the control unit disposed on the first bracket or the second bracket, the flexible printed circuit board electrically coupled to the display unit and the control unit via the shaft structure, wherein the soft covering material covers the flexible printed circuit board and the control unit, and the display unit receives and displays an electrical signal from the control unit via the flexible printed circuit board.

6. The wearable device as claimed in claim 1, wherein the shaft structure comprises a multi-section hinge mechanism, the multi-section hinge mechanism comprises a rotation angle positioning portion, a first rotating portion and a second rotating portion, and the rotation angle position portion, the first rotating portion and the second rotating portion has a plurality of hooks or recesses thereon, used for positioning or locking each other.

7. The wearable device as claimed in claim 6, wherein the shaft structure further comprises a first protective member and a second protective member, the first protective member is fixed to the first bracket and the second protective member is fixed to the second bracket.

8. The wearable device as claimed in claim 1, wherein the shaft structure comprises a torsion spring, a first fixing portion, a second fixing portion and a pivoting shaft, and the pivoting shaft passes through between the torsion spring, the first fixing portion and the second fixing portion.

9. The wearable device as claimed in claim 8, wherein the torsion spring has an annular spring structure, and the soft covering material covers at least a portion of the annular spring structure.

10. The wearable device as claimed in claim 1, wherein the shaft structure comprises an elastic pad, and two ends of the elastic pad are respectively fixed on the first bracket and the second bracket.

* * * * *